United States Patent
Furukawa et al.

[11] Patent Number: 5,949,700
[45] Date of Patent: Sep. 7, 1999

[54] FIVE SQUARE VERTICAL DYNAMIC RANDOM ACCESS MEMORY CELL

[75] Inventors: Toshiharu Furukawa, Essex Junction; Mark C. Hakey, Milton; David V. Horak, Essex Junction, all of Vt.; William H. Ma, Fishkill; Jack A. Mandelman, Stormville, both of N.Y.

[73] Assignee: International Business Machines Corporation, Armonk, N.Y.

[21] Appl. No.: 09/165,503

[22] Filed: Oct. 2, 1998

Related U.S. Application Data

[62] Division of application No. 09/085,965, May 26, 1998.

[51] Int. Cl.$^6$ ....................................................... G11C 13/00
[52] U.S. Cl. ................................................................. 365/51
[58] Field of Search .......................... 365/51, 63, 189.01, 365/230.01

[56] References Cited

U.S. PATENT DOCUMENTS

| | | |
|---|---|---|
| 4,462,040 | 7/1984 | Ho et al. . |
| 4,630,088 | 12/1986 | Ogura et al. . |
| 4,801,988 | 1/1989 | Kenney . |
| 4,894,697 | 1/1990 | Chin et al. . |
| 4,920,065 | 4/1990 | Chin et al. . |
| 4,941,026 | 7/1990 | Temple . |
| 4,977,436 | 12/1990 | Tsuchiya et al. . |
| 5,001,526 | 3/1991 | Gotou . |
| 5,071,782 | 12/1991 | Mori . |
| 5,073,519 | 12/1991 | Rodder . |
| 5,136,350 | 8/1992 | Itoh ............................................ 365/63 |
| 5,177,027 | 1/1993 | Lowrey et al. . |
| 5,185,646 | 2/1993 | Mizuno . |
| 5,198,383 | 3/1993 | Teng et al. . |
| 5,231,037 | 7/1993 | Yuan et al. . |
| 5,324,673 | 6/1994 | Fitch et al. . |
| 5,350,708 | 9/1994 | Yagishita et al. . |
| 5,362,665 | 11/1994 | Lu . |
| 5,414,288 | 5/1995 | Fitch et al. . |
| 5,480,838 | 1/1996 | Mitsui . |
| 5,504,359 | 4/1996 | Rodder . |

FOREIGN PATENT DOCUMENTS 8064810  3/1996  Japan .

OTHER PUBLICATIONS

S. Nakajima et al.; A Trench MOSFET With Surface Source/Drain Contacts; IEDM; CH2252–5/85/000–0200; 1985; pp. 200–203.

W.F. Richardson, et al., A Trench Transistor Cross–Point DRAM Cell; IEDM, CH2252–5/85/0000–0714, 1985; pp. 714–717.

B. Wu; Pillar DRAM Cell with Dual Channels and an Underneath Trench–in–Trench Capacitor Built on Soi Structure; IBM Technical Disclosure Bulletin, vol. 36 No. 11;

*Primary Examiner*—Terrell W. Fears
*Attorney, Agent, or Firm*—Whitham, Curtis & Whitham; Howard J. Walter, Jr.

[57] ABSTRACT

Five square dynamic random access memory (DRAM) cell is prepared with a vertical transfer device with long channel length. In this construction, channel length is not affected by cell size scaling requirements.

1 Claim, 19 Drawing Sheets

| | |
|---|---|
| 101 | PROCESS WAFER WITH ION IMPLANTING UP TO FORMATION OF FILLED AND PLANARIZED DEEP TRENCHES |
| 102 | ETCH SILICON USING GATE LENGTH AND SHALLOW TRENCH ISOLATION MASKS AND PLANARIZED WITH OXIDE |
| 103 | PATTERN POLYSILICON PLUG MASK AND ETCH OXIDE FILL |
| 104 | FILL COLLAR GAP WITH INTRINSIC POLYSILICON, ETCH AND ION IMPLANT TO FORM SOURCE |
| 105 | PERFORM SACRIFICIAL AND GATE OXIDATION |
| 106 | FILL WITH GATE POLYSILICON AND PLANARIZED |
| 107 | FILL WITH OXIDE AND PLANARIZED |
| 108 | RECESS GATE CONDUCTOR OXIDE CAP AND BUILD NITRIDE SPACER AND REFILL WITH OXIDE |

FIG.3

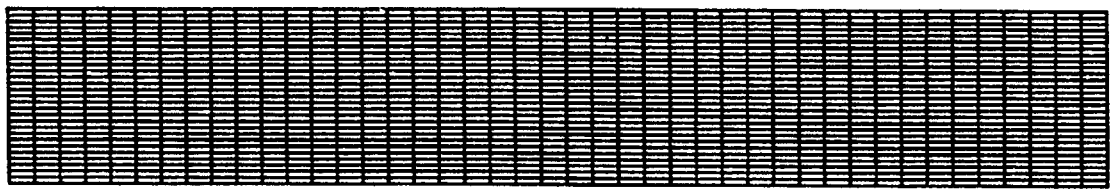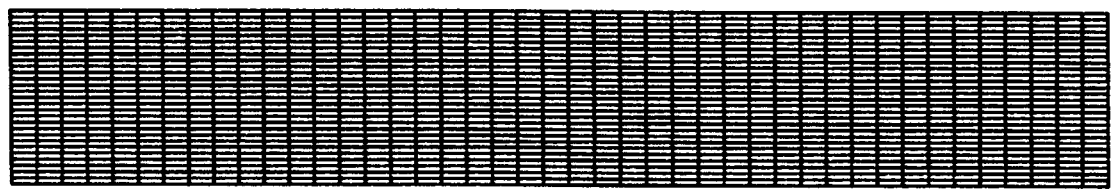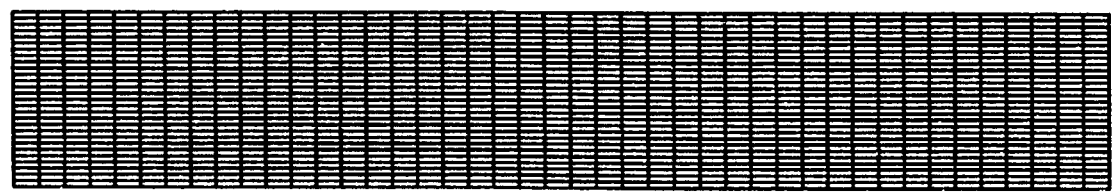
FIG.6

FIVE SQUARE VERTICAL DYNAMIC RANDOM ACCESS MEMORY CELL

CROSS-REFERENCE TO RELATED APPLICATIONS

This patent application is a divisional patent application of U.S. Ser. No. 09/085,965 filed May 26, 1998, and the complete contents of that application is herein incorporated by reference.

BACKGROUND OF THE INVENTION

1. Field of the Invention

The present invention generally relates to computer chip manufacture and more particularly to dynamic random access memory cells for the 1 Gbit arena.

2. Background Description

In the migration to the 1 Gbit generation, the dynamic random access memory (DRAM) cells start to pass the 8 square (4×2 lithographic features) folded bit-line architecture limits. As illustrated in FIG. 1, predictions show that the one Gbit memory cell will be approximately a six square (3×2 lithographic features) cell. As can be seen in FIG. 1, solid line 1 represents the 8 square cell. As cell area requirements are decreased, the 8 square cell will be too large to meet density requirements for the number of chips on a wafer and too large to fit on a standard package.

One design is the merged isolation node trench (MINT) DRAM cell. As discussed in L. Nesbit et al. "A 0.6 $\mu m^2$ 256 Mb Trench DRAM Cell with Self-Aligned buried strap (BEST)," proceedings of the 1993 IEEE International Electron Devices Meeting; Technical Digest-International Electron Devices Meeting, 1993, pp. 627–630, the DRAM cell has shallow trench isolation (STI) constructed between adjacent trench capacitor cells. In this DRAM trench cell the transfer device region is bounded by shallow trench isolation oxide. The problem with the MINT cell design is the linear nature of the cell. All the active elements are ordered in a straight line. This gives the cell advantage over other designs in the way the cell responds to overlays of various masking levels, but it makes it difficult to scale below 8 square. Space must be provided for bitline contact, transfer device, buried strap, deep trench and isolation. This is shown in the top view of FIG. 2, where cell length is represented by arrow 10. Bitline contact 11 and diffusion 12 are provided on either side of active wordline 13. Deep trenches 14 are within passing wordline 15. All structures are surrounded by STI 16.

In the 1 Gbit time frame, the industry needs to push past the 8 square limits to achieve manufacturable chip size targets.

SUMMARY OF THE INVENTION

It is therefore an object of the present invention to provide a vertical transfer device dynamic random access memory cell for the one Gbit and beyond arena which reaches 5 square (2.5×2 lithographic features) in size.

It is another object to provide DRAM design which is compatible in a folded bit-line architecture with the spacer wordline wiring scheme.

With the design proposed here, the channel length is independent of cell size. By integrating a robust transfer device in a cell like the previously described merged isolation node trench (MINT), the device channel length requirement is separated from the cell size requirement. The inventive method produces a structure having a pedestal which supports a vertical field effect transistor transfer device. The vertical transfer device has a minimal width and relatively long channel length. Each pedestal in the inventive structure has sources, gates, and drains for two independent cells.

BRIEF DESCRIPTION OF THE DRAWINGS

The foregoing and other objects, aspects and advantages will be better understood from the following detailed description of a preferred embodiment of the invention with reference to the drawings, in which:

FIG. 3 is a flow chart of the process sequence of the present invention;

FIG. 6 is a top down view of one of two masks used to form the active device pillar regions;

DETAILED DESCRIPTION OF A PREFERRED EMBODIMENT OF THE INVENTION

Figure 1:
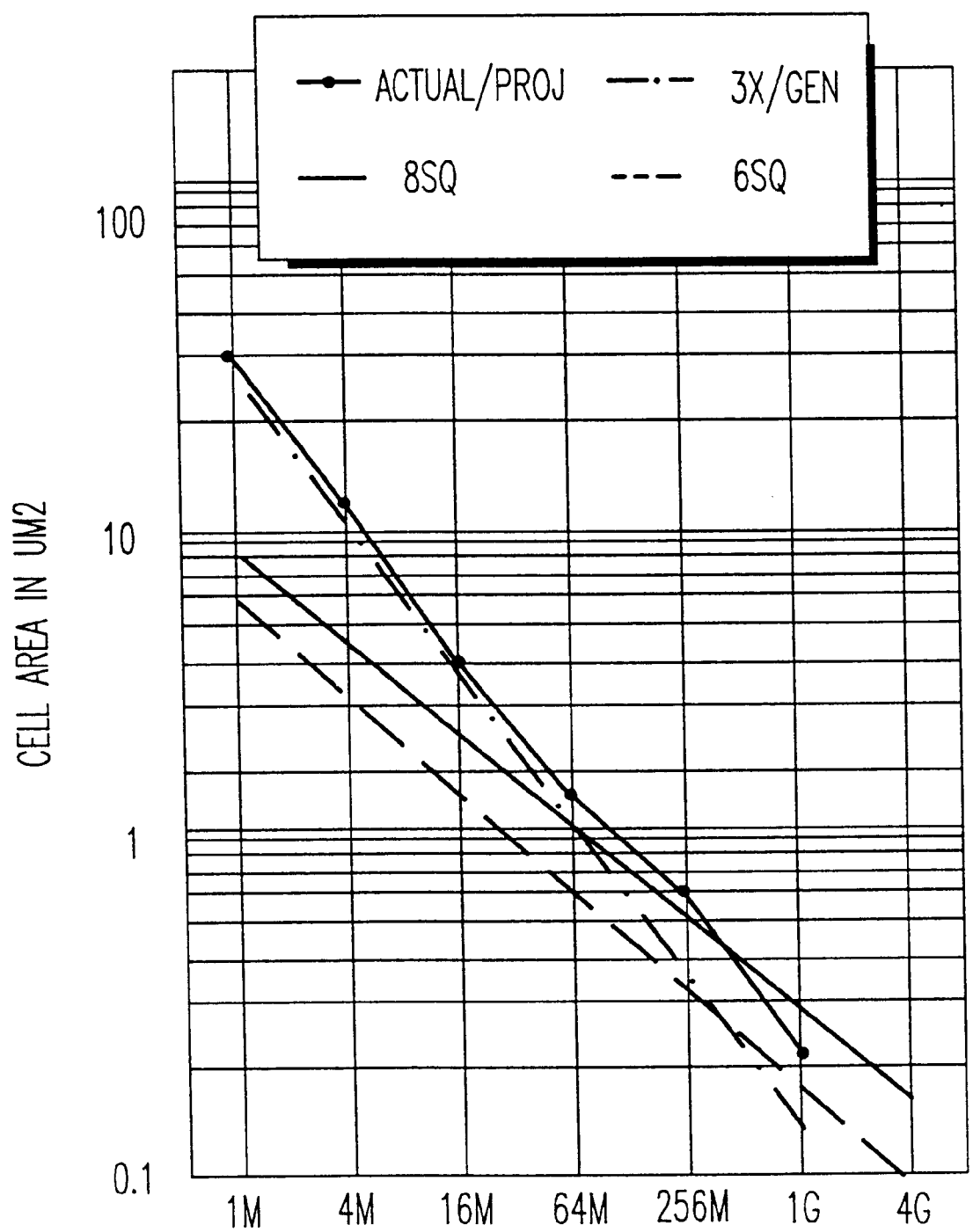
FIG. 1 is a graph showing cell area requirements per generation.
Figure 2:
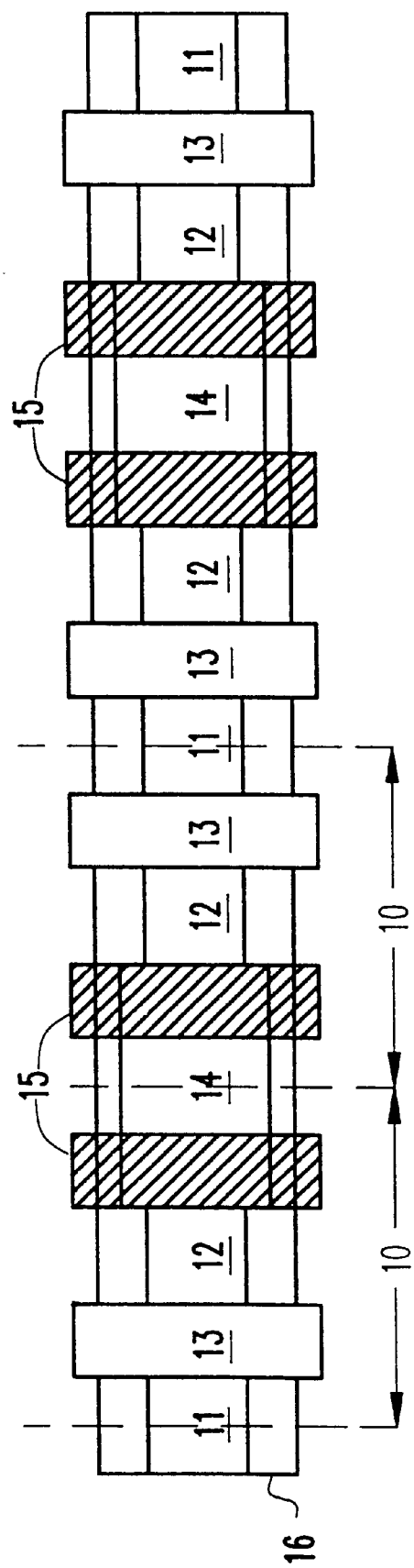
FIG. 2 is a top view of a prior art 8 square cell.

Referring now to the drawings, and more particularly to FIG. 3, there is shown a flow chart of the process sequence of the present invention.

As can be seen from the step shown in block 101, the process begins with a wafer which is similar to wafers used in Merged Isolation Node Trench (MINT) processing as described in U.S. Pat. No. 4,801,988 to Kenney, which is herein incorporated by reference. In the initial steps the inventive process varies by adding arsenic implantation and out diffusion steps. Start with a wafer with a top thickness of ~1 μm doped to the concentration of the vertical device channel. Follow with a bit line drain ion implant (arsenic) to form the top part of the device. Then, as in MINT processing, a quick oxidation, a thin nitride layer and TEOS are formed on the substrate. Then, a deep trench is formed and arsenic is out diffused to form the buried plate. Then, as in MINT processing, a thin insulating layer lines the trench. The trench is filled with polysilicon and etched back partially. Thick insulating sidewalls are formed for a collar in the partially etched upper portion of the trench. The upper trench is filled with polysilicon and planarized. Pad structure is retained and will become part of the cell. At this point, similarities to MINT processing end.

Figure 4:
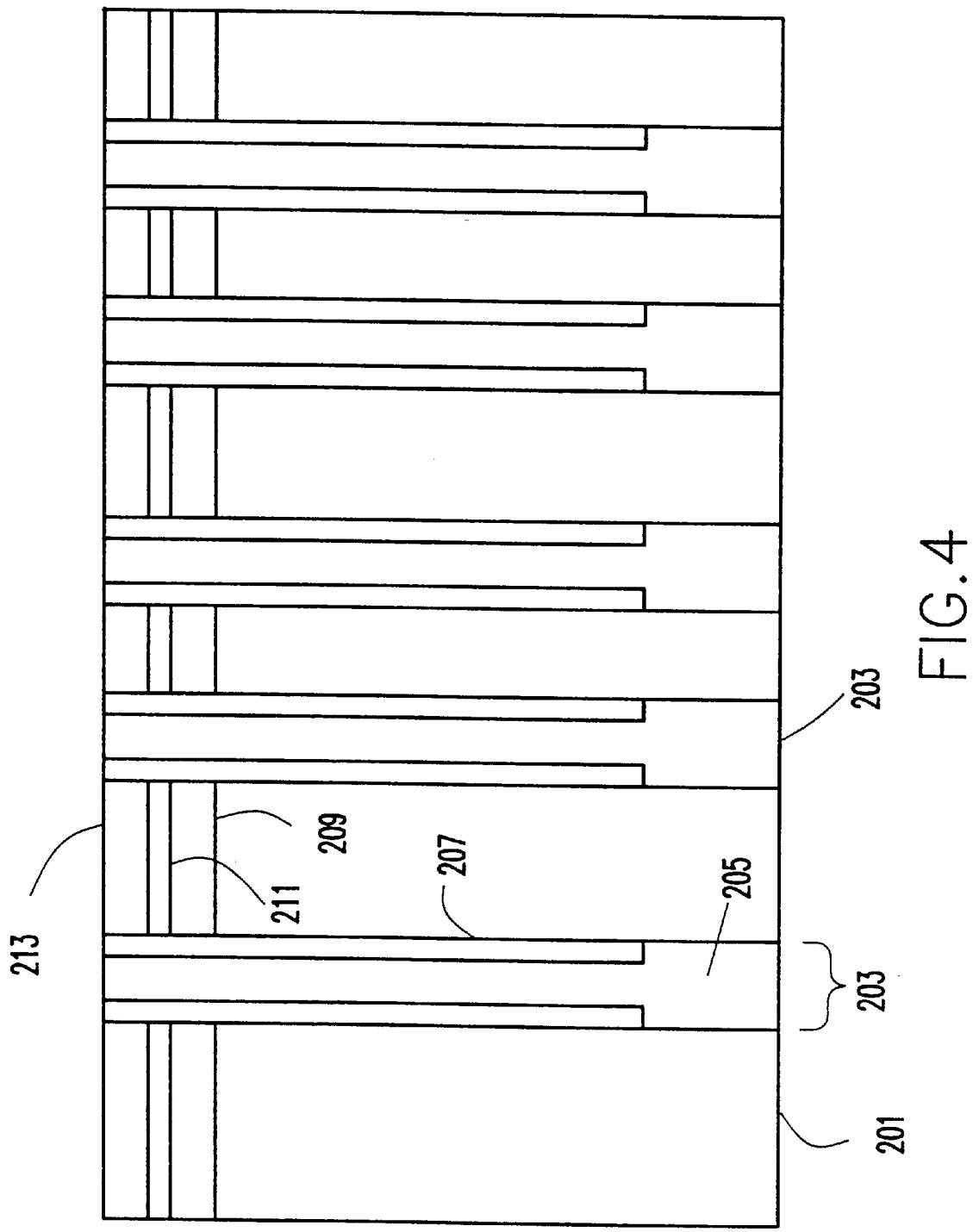
FIG. 4 is a cross sectional view showing the formation of deep trenches for the inventive device.

The results of this step are shown in the cross section shown in FIG. 4. In FIG. 4, there is shown a wafer 201, composed of single crystal silicon, having deep trenches 203 filled with doped poly silicon 205 and having oxide collars 207. There is an ion implanted layer 209 which is to act as the source/drain, a thin oxide pad stressor layer 211, and a pad nitride 213 layer. The pad nitride structure is retained and will become part of the cell.

Figure 5:
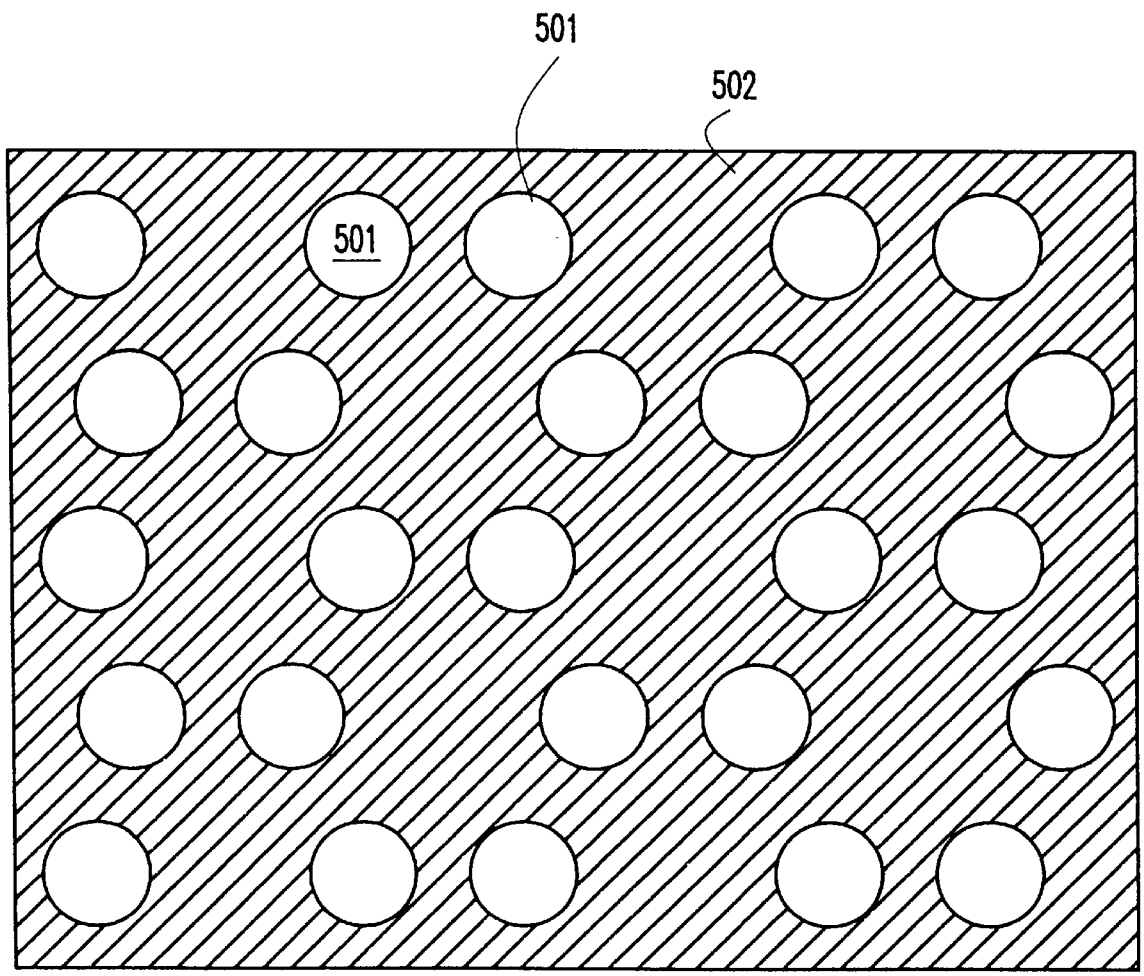
FIG. 5 is a top down view of the mask used to form deep trenches.

FIG. 5 shows a top down view of the mask used during the process of etching the deep trenches. In this mask, round holes 501 are surrounded by resist 502.

Returning to the flow chart in FIG. 3, the next step is to pattern the gate mask, etch to form the transfer device pillar, as shown in the step shown in block 102. Then an isolation mask is patterned and etched to recess the oxide isolation region, followed by oxide fill and planarization, as outlined in step 102 of FIG. 3.

Figure 7:
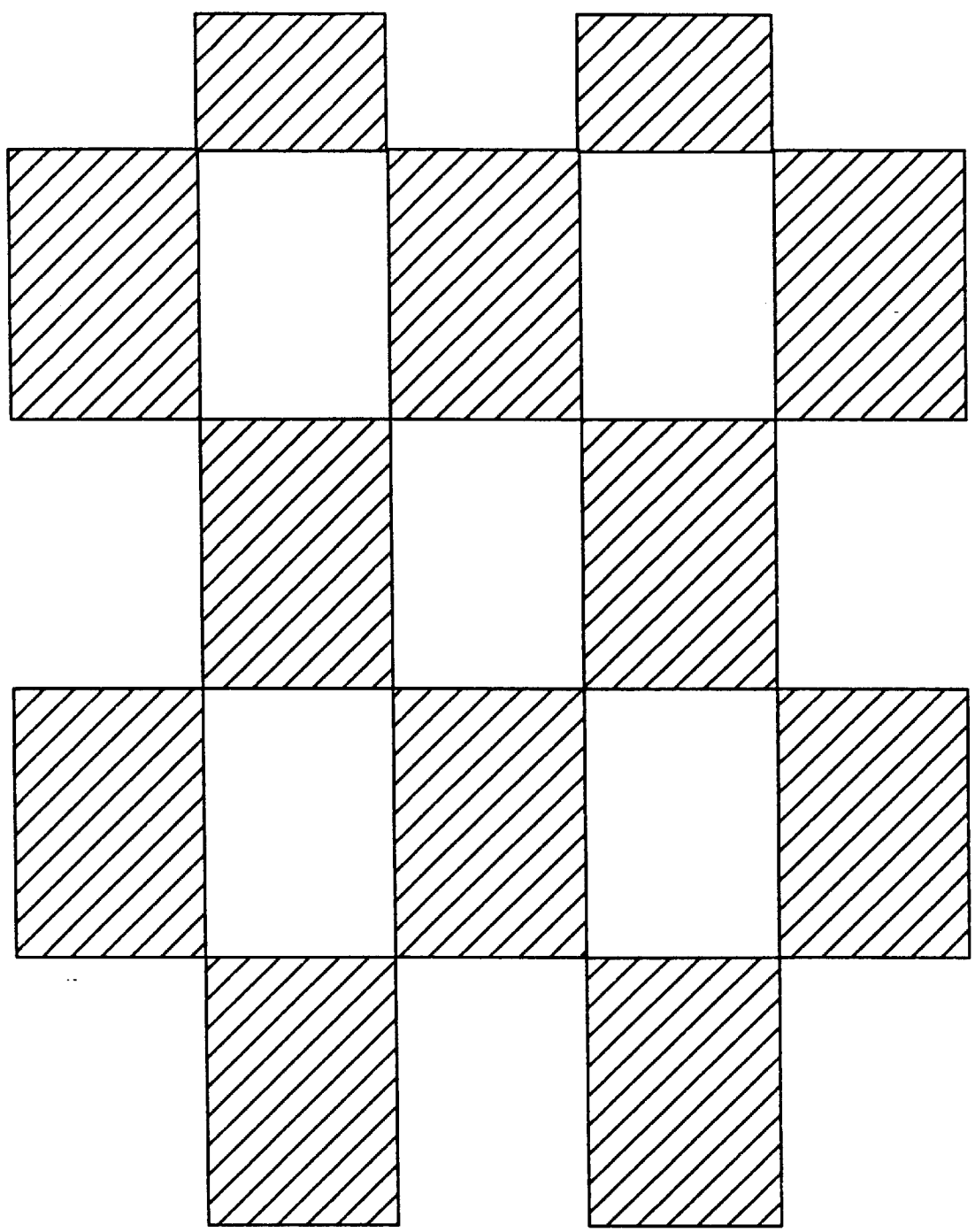
FIG. 7 is a top down view of the second of two masks used to form the active device pillar regions.
Figure 8:
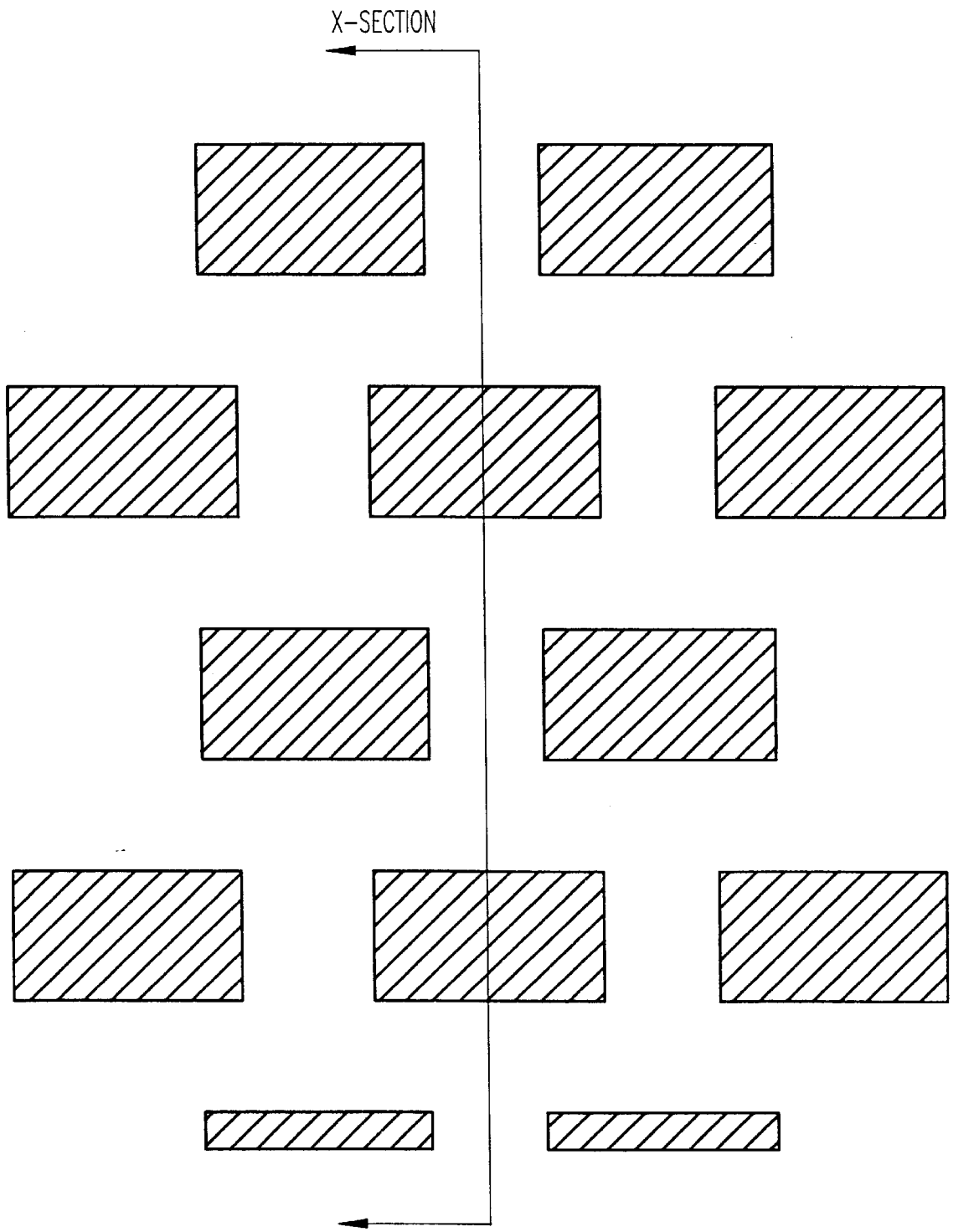
FIG. 8 is a top down view of the resulting stencil formed by the combination of masks shown in FIGS. 5 and 6.
Figure 9:
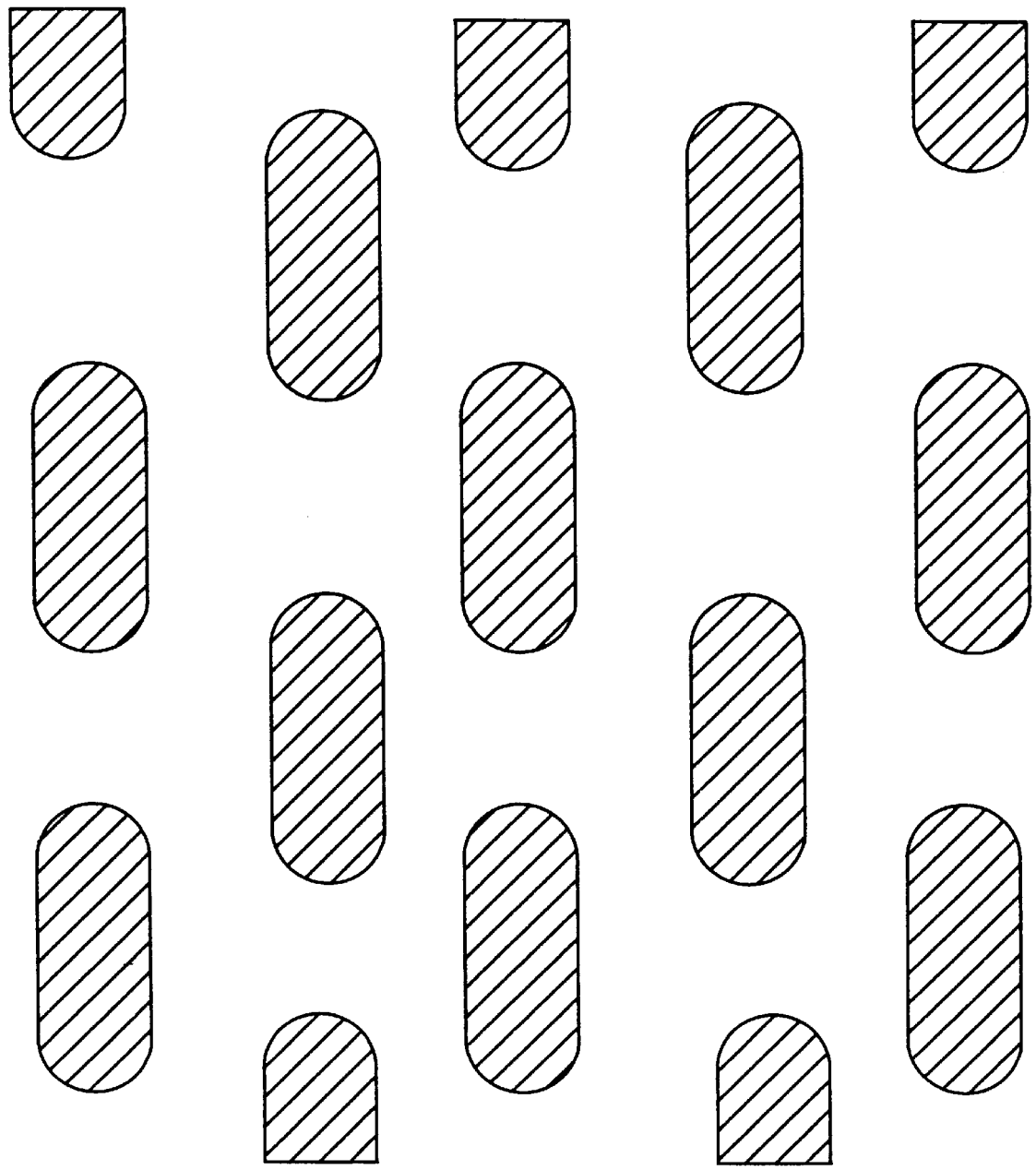
FIG. 9 is a top down view of the mask used in forming the lower STI regions.

Two masks are used to guarantee flat vertical transfer device surface in the upper shallow trench isolation. FIGS. 6 and 7 show top down views of the masks used. The gate pillar mask shown in FIG. 6 is used first followed by the second gate pillar mask shown in FIG. 7. The preferred etching process for obtaining the upper shallow trench isolation region 217 in FIG. 10, or gate line region results in an image which does not have rounded corners. In a substrate with a layer of etchable material or resist, multiple parallel edged openings are formed in the etchable material, in the pattern as shown in the mask of FIG. 6. After a second layer of etchable material is deposited, a second set of parallel edged openings is formed, in a pattern as shown in the mask of FIG. 7. This second set of parallel edged openings is bounded by the first set of parallel edged openings. The wafer is patterned by the first and second sets of openings and is then processed by etching the resultant combined image into the substrate. For the masks shown in FIGS. 6 and 7, the combined image appears as in FIG. 8. FIG. 8 shows that area which was not masked by either the mask shown in FIG. 6 or the mask shown in FIG. 7. Various combinations of positive and negative masks in combination with dark and open chrome areas can be used to accomplish the final structure. The cross-sectional Figures correspond to the cut indicated on FIG. 8. After printing and etching the pillar, 511 shown in FIG. 10, another mask is used for creating the shallow trench isolation area, 512, with depth 219, shown in FIG. 10. FIG. 9 shows the resist image used to form the shallow trench isolation. The height of the pillar 217 will determine the length of the array transfer device.

The shallow trench isolation separates the strap diffusions. The shallow trench etch is designed to be selective to the pad nitride and the resist mask.

Figure 10:
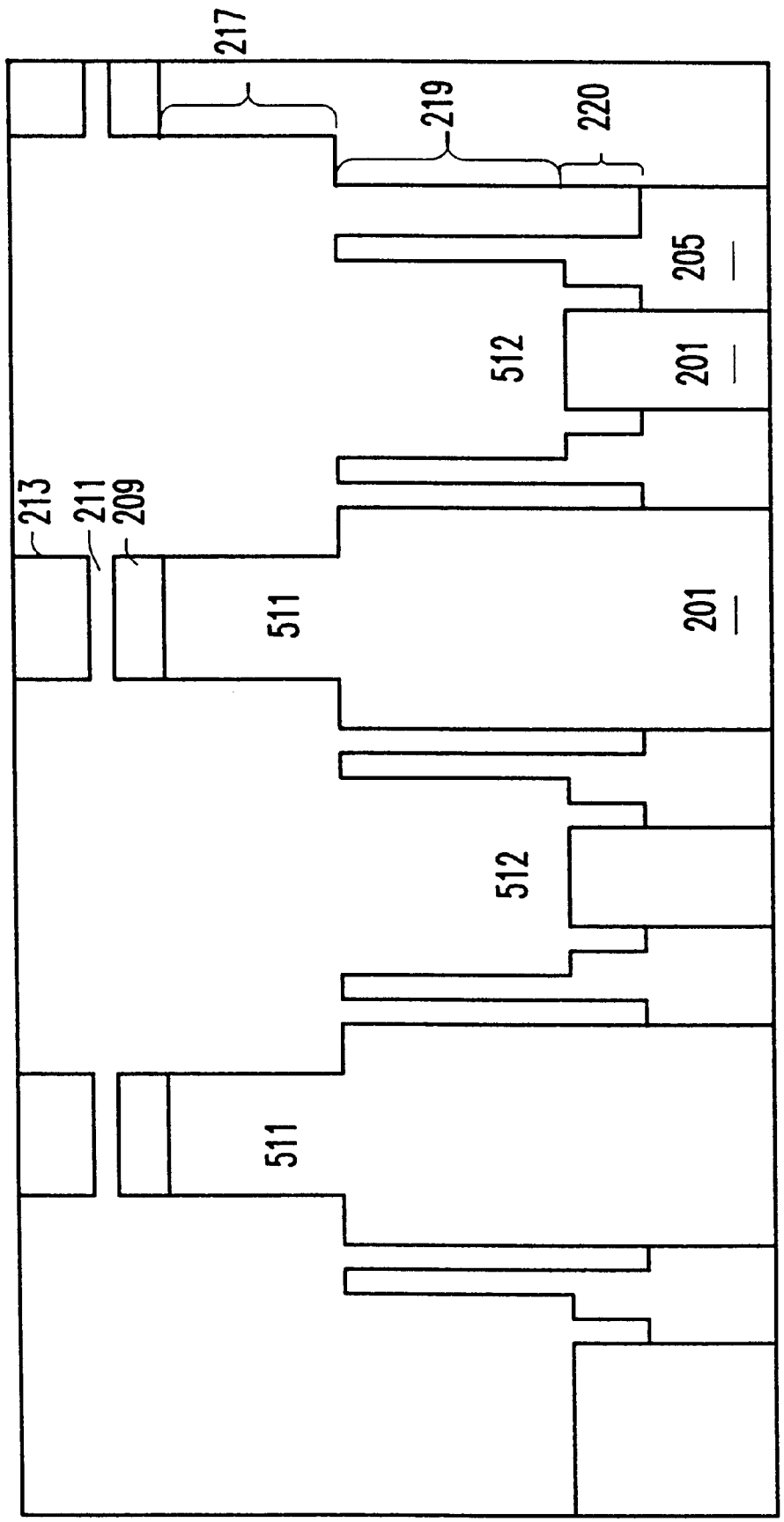
FIG. 10 is a cross sectional view showing the formation of shallow trench isolation (STI) regions for the device and the pillar for the transfer device.

The substrate surface is cleaned by means of a sacrificial oxidation of the pillar and shallow trench isolation, followed by ion implantation of the transfer gate channel region. Then, the combined pillar and trench area is filled with oxide and planarized to the surface of the pad nitride film 213. A cross section of the device following these steps is shown in FIG. 10.

The next step as shown in block 103 in FIG. 3, is to pattern the polysilicon plug mask 223 (shown in FIG. 11) and etch the fill oxide selective to pad nitride, silicon and resist. Even after the strap diffusion silicon is reached, etching continues to depth 513, removing part of the collar, leaving enough fill oxide in the shallow trench isolation regions to provide good isolation. The etched void in the collar is where the strap will be made.

Figure 11:
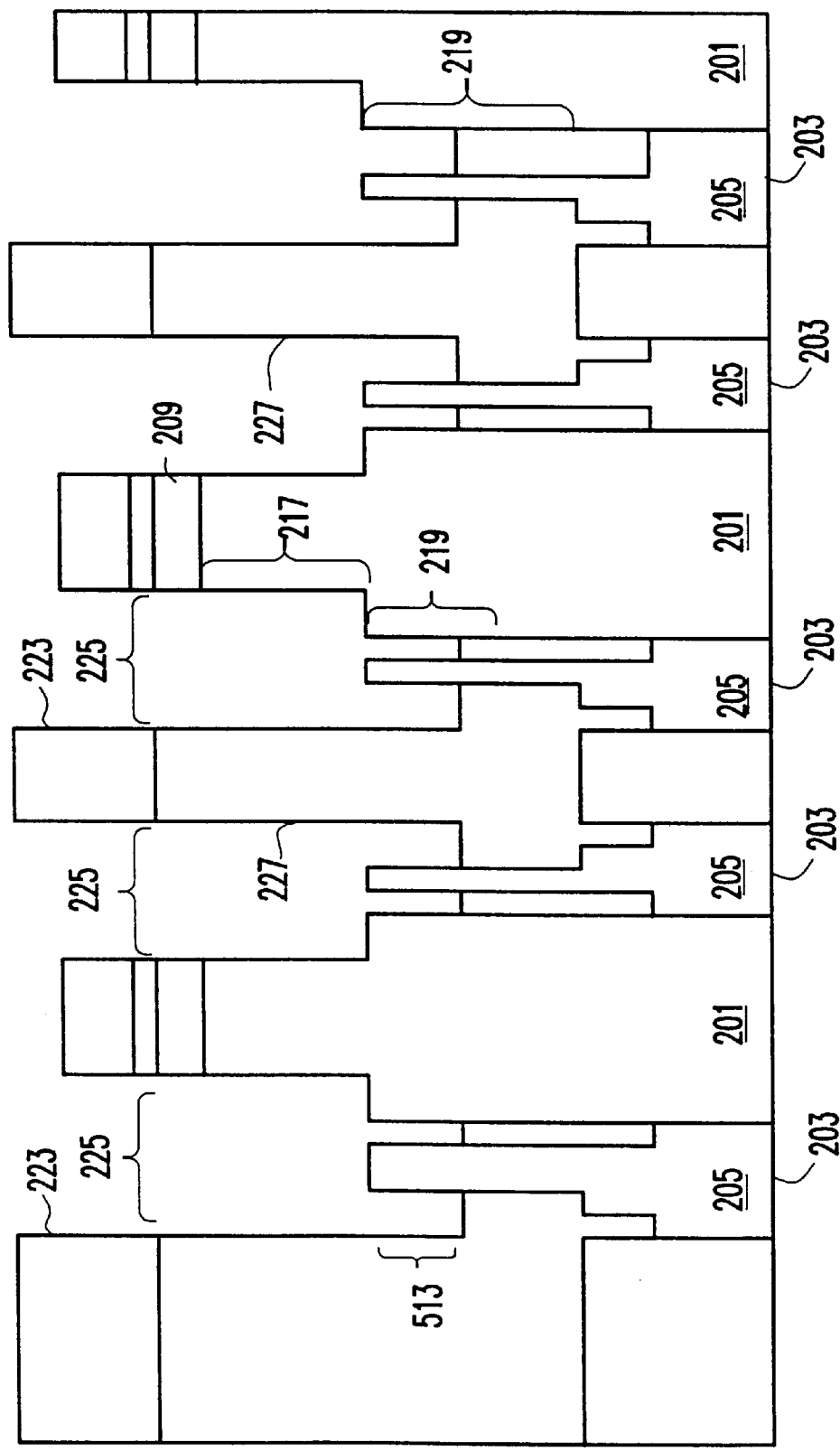
FIG. 11 is a cross sectional view showing the etching of STI regions for the polysilicon plug.
Figure 12:
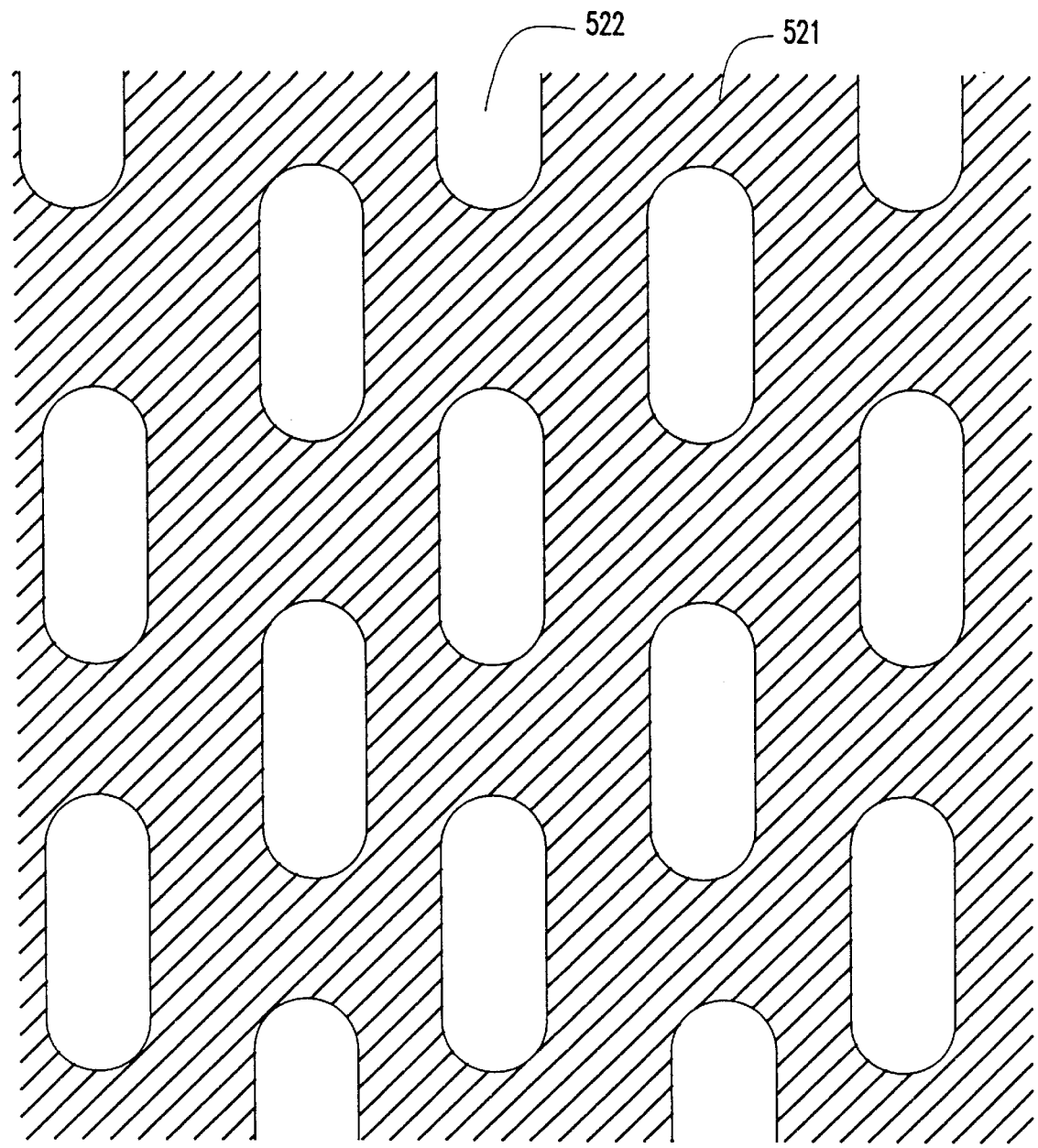
FIG. 12 is top down view of the mask for the polysilicon plug.

As shown in FIG. 11, the pedestals 227 of oxide which remain below the plug mask 223 will become the insulation between the gates of the devices. FIG. 12 shows a top down view of the polysilicon plug resist image in which resist 521 surrounds openings 522 for etching shallow trench isolation material.

In the step shown in block 104 of FIG. 3, the whole structure is coated with a thin layer of polysilicon and etched isotopically to remove it from all the sidewalls. The thickness of the layer is enough to fill the collar gap and etching will leave a depression of the polysilicon in the collar gap. Afterwards an ion implant is used to form the source/drain diffusion and to tie the strap to the vertical transfer device.

Figure 13:
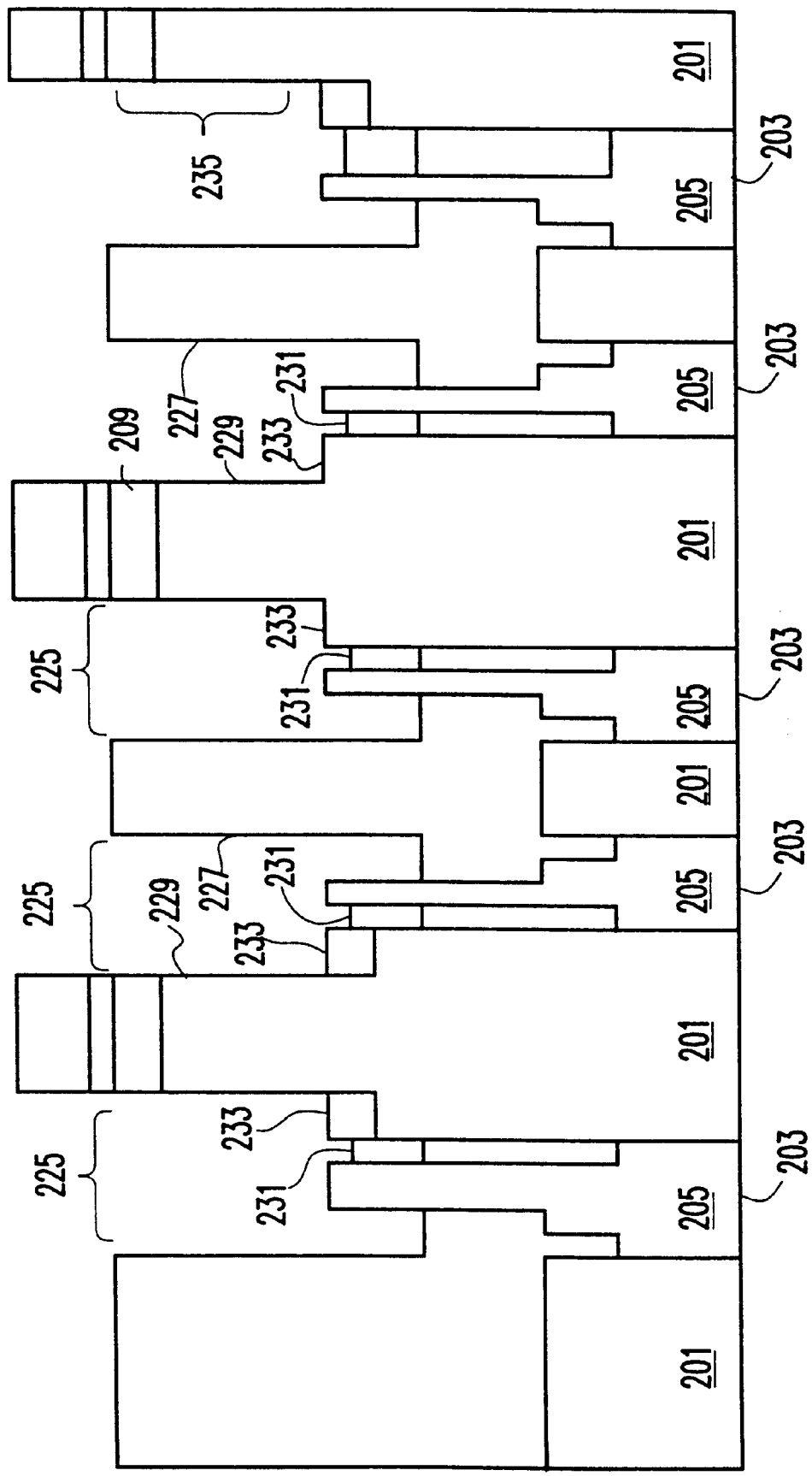
FIG. 13 is a cross sectional view showing the filling of the void formed by the etching of the collar and ion implantation for source/drain region.

Following the above described steps the structure will appear as the cross sectional view shown in FIG. 13. A strap 231 consisting of polysilicon fills the collar gap which was etched during the previous oxide etch. A source 233 has been formed in the single crystal silicon by ion implantation at the base of the pillar 511. The strap 231 provides a contact between the deep trench polysilicon 205 and the source/drain of transfer device 233.

Then, as shown in block 105 of FIG. 3, a sacrificial oxidation and gate oxidation is performed on the transfer device. The conditions and thickness of the sacrificial oxidation are chosen to maximize the oxide growth on the deep trench polysilicon fill and strap to allow for the gate conductor-node separation.

Figure 14:
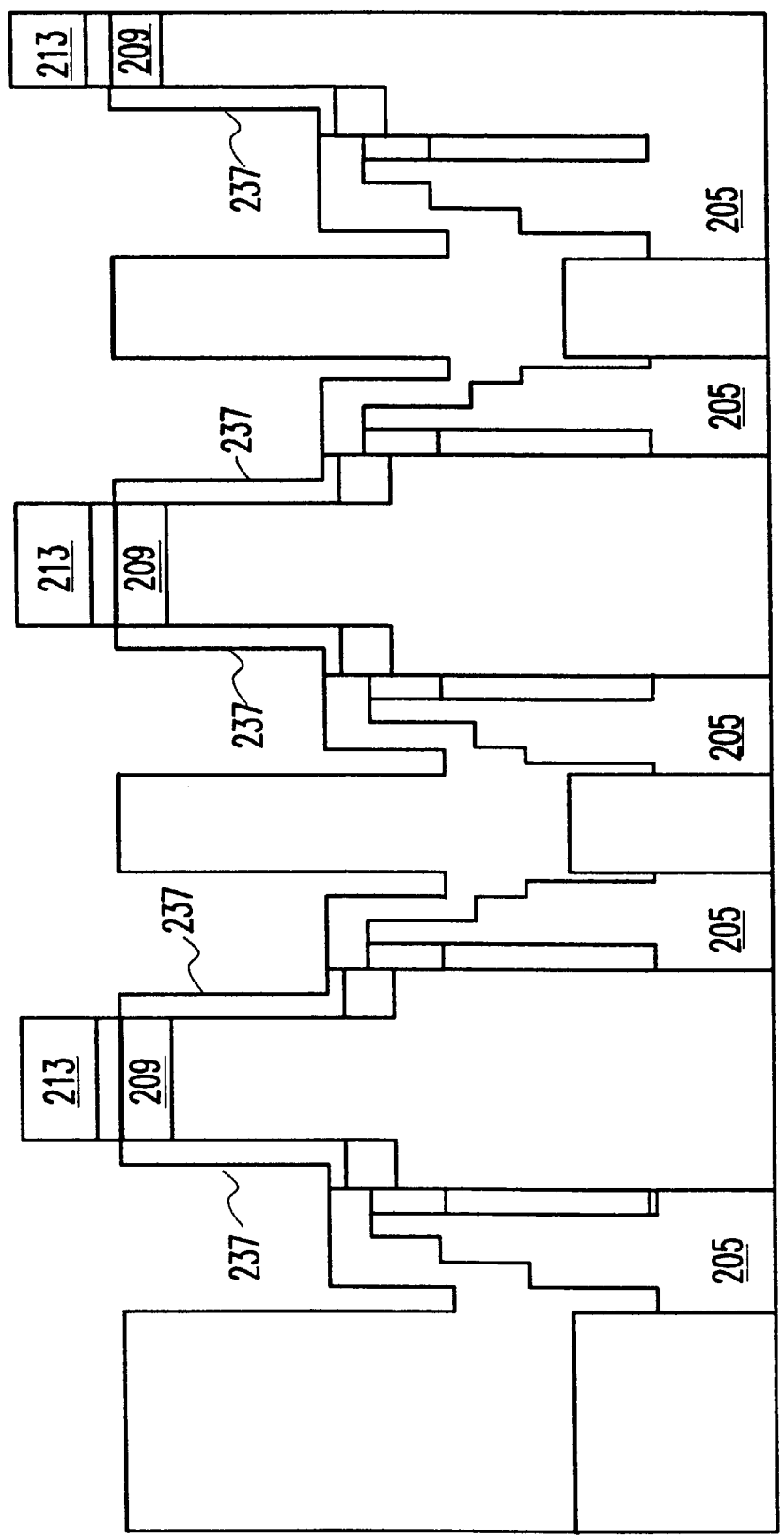
FIG. 14 is a cross sectional view showing the formation of the device following a sacrificial oxidation of exposed polysilicon surfaces.

As can be seen in FIG. 14, the sacrificial oxidation consumed some of the deep trench doped polysilicon fill 205. A layer of oxide now coats all silicon surfaces. The oxide grown during gate oxidation 237 will act as insulation between the gate polysilicon plug and the deep trench polysilicon fill. Other techniques as directional sputtering or evaporation can also be used to enhance the isolation.

Then, as shown in block 106 of FIG. 3, the gate polysilicon 241 is filled, planarized and recessed. Then, as shown in block 107 of FIG. 3 the recess is filled with oxide and replanarized. This structure represents the basic cell.

Figure 15:
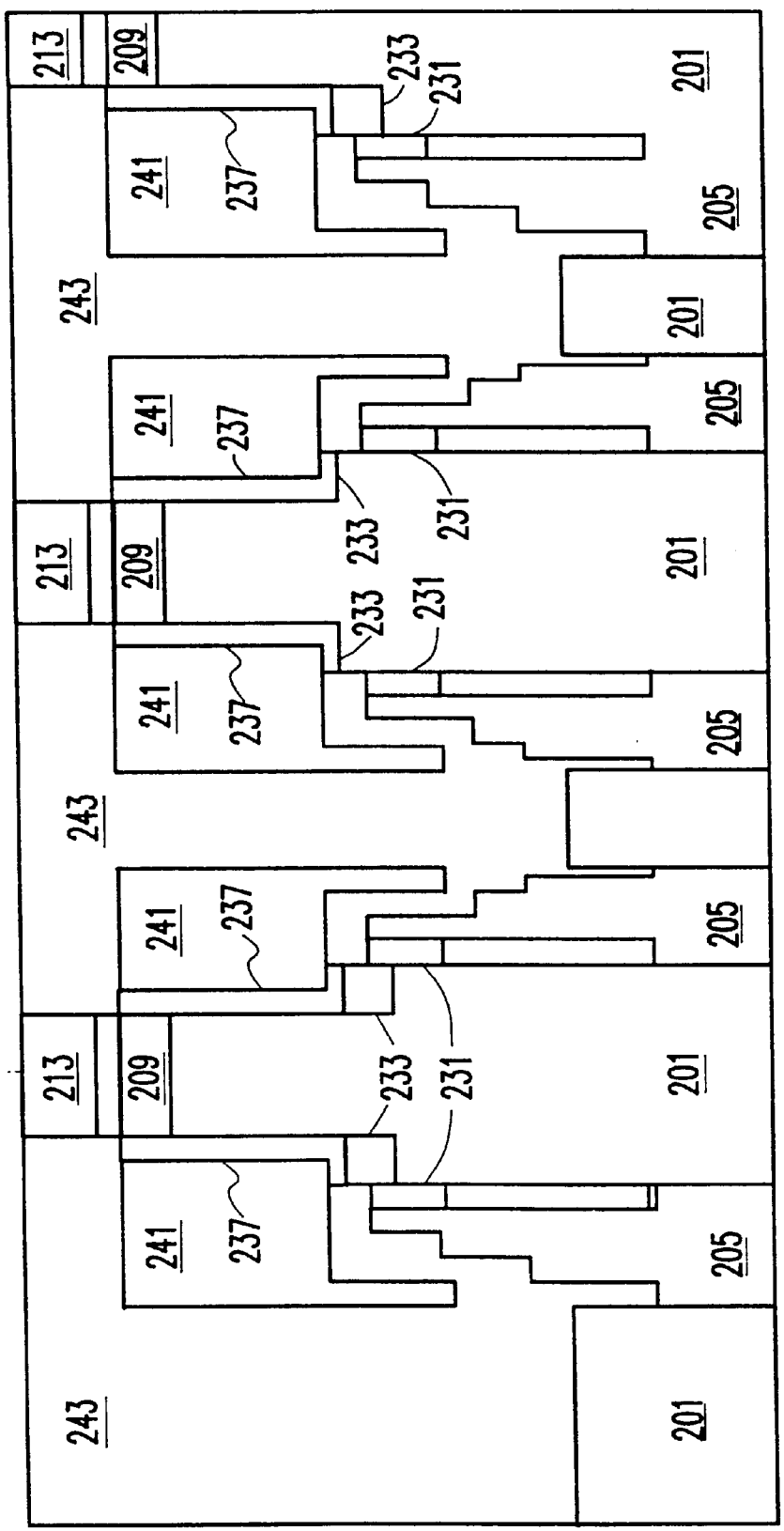
FIG. 15 is a cross sectional view showing the formation of the basic cell.

FIG. 15 shows the basic cell having polysilicon gate 241 surrounded by chemical vapor deposited oxide 243. The bitline source/drain region is an ion-implanted region into the single crystal silicon surface which is separated from a nitride cap by a thin layer of oxide.

The step shown in block 108 of FIG. 3 is added to allow for a folded bitline architecture design with spacer wordline. With the relatively small space in which to place the spacer word line, the word line will need to be borderless to the bitline contact area. This can be done with nitride spacers 249 formed on the pad nitride 213, a "beanie" structure, in FIG. 16. The gate conductor oxide cap is recessed and a nitride spacer is built. A nitride etch is used to reach the source/drain area and is stopped in the gate conductor cap oxide 243. The wordline contact is etched selective to nitride so as not to contact the source/drain region.

Figure 16:
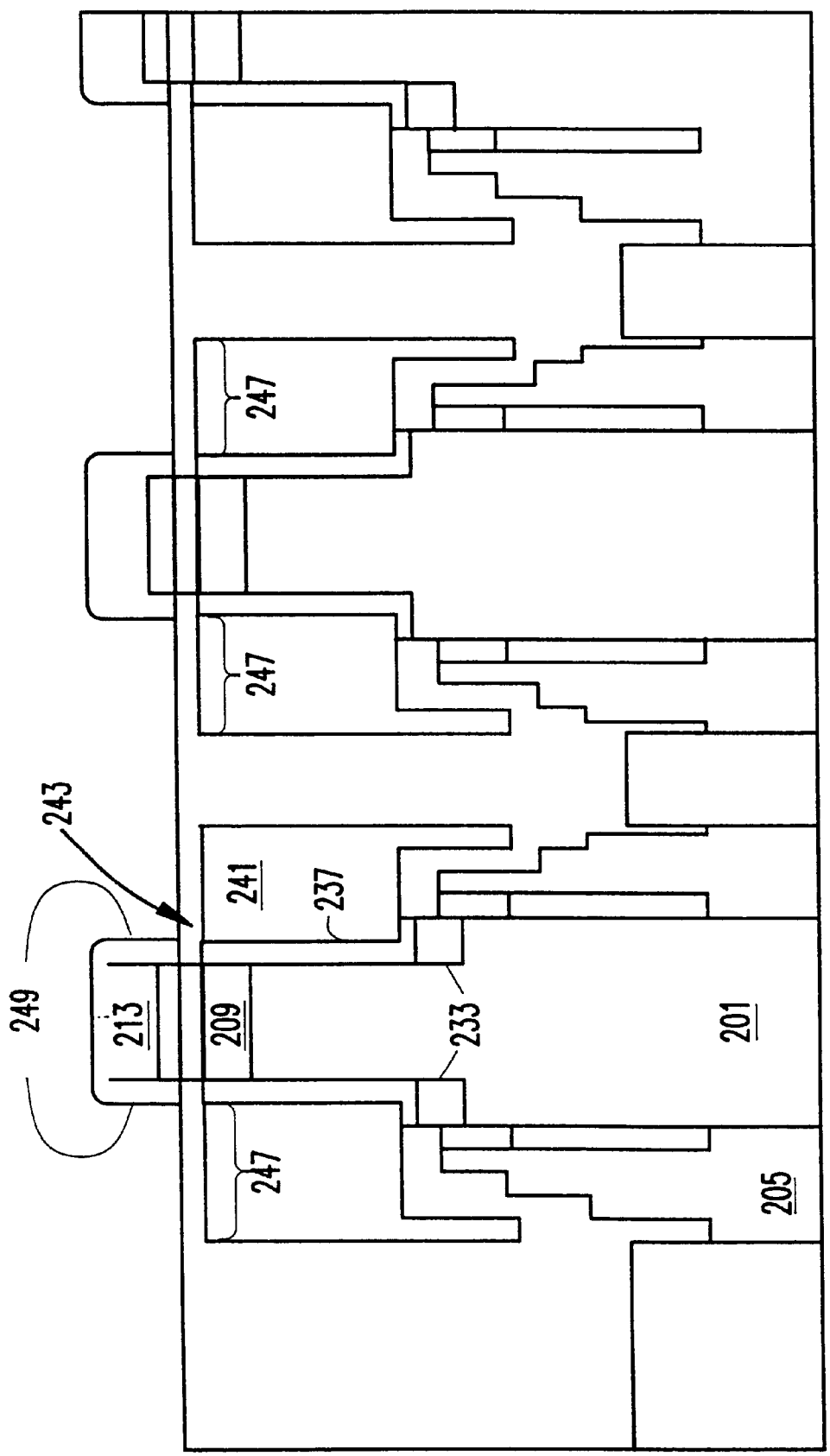
FIG. 16 is a cross sectional view showing the formation of the basic cell with the addition of bitline diffusion cap.

The results of the steps shown in block 108 of FIG. 3 are shown in FIG. 16. In the cross sectional view shown in FIG. 16, there is a recess of the oxide 243 in the gate conductor cap region 247. The nitride pad 213 remains with nitride spacers 249 added, to form a "beanie".

Figure 17:
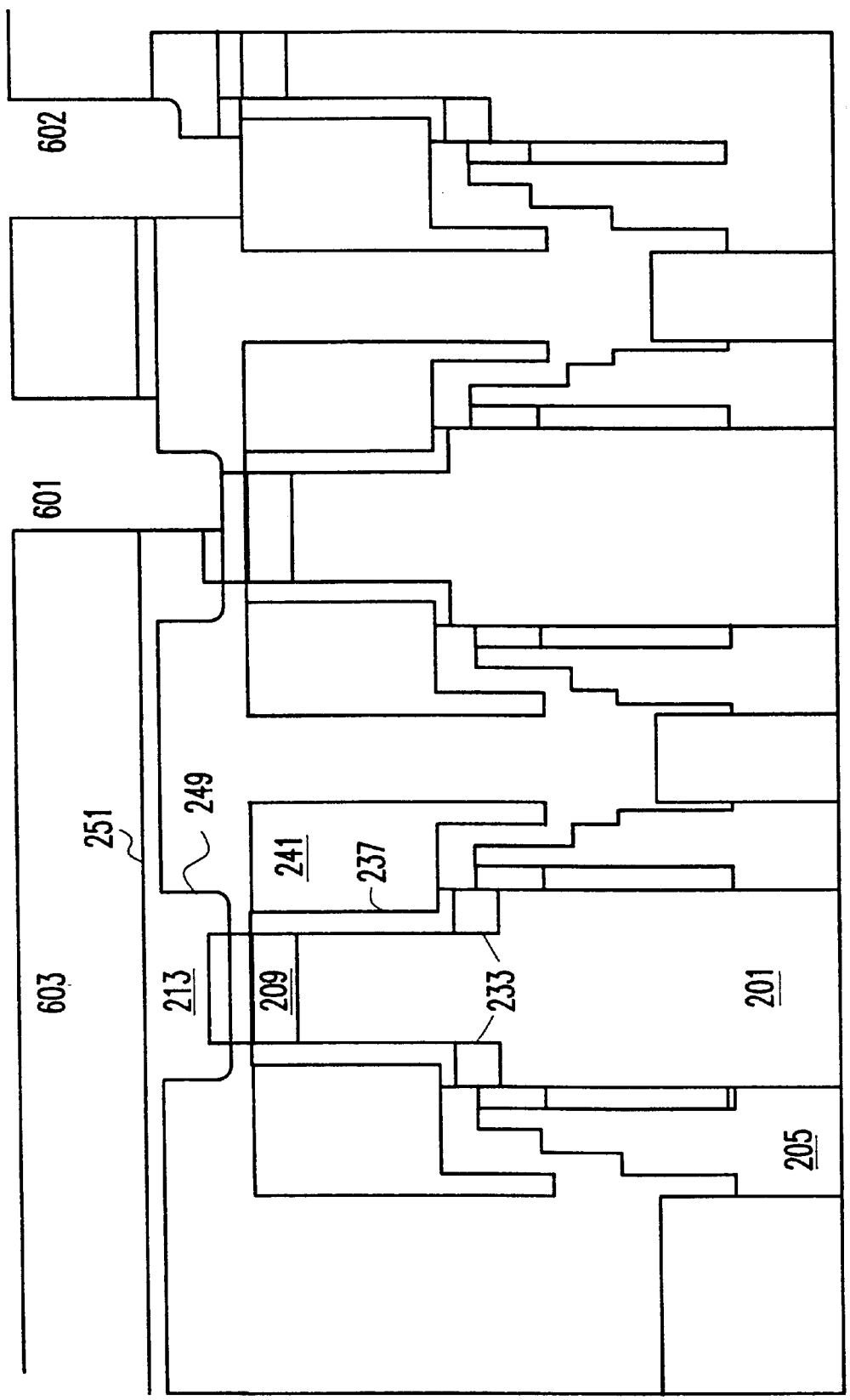
FIG. 17 is a cross sectional view showing the formation of the basic cell having a nitride etch stop layer.

An alternative embodiment, as shown in FIG. 17, in which the selectivity requirements can further be reduced, is produced by adding a nitride etch stop layer 251 below oxide layer 603. In this method both spacer word line and bit line contact oxide etches can stop on the nitride layer. Separate masks are used to form the word line conductors and the source/drain bitline contact.

In the word line processing, a masked opening is created and etched through the oxide 603, nitride 251 and oxide 243 to link the isolated gate polysilicon plugs into a continuous structure. Subsequently, the oxide space 602 is filled with a conductor, such as polysilicon, tungsten, aluminum, etc. to form the conductive word line. Prior to depositing the conductor, a barrier material may be formed to separate the polysilicon plug from the conductive material. As known in the art, titanium nitride is commonly used as a barrier layer.

Similarly, in the formation of the source/drain contacts 601, a masked opening is created and etched through oxide 603, nitride 251, and oxide 243 to the top of the pillar 512, while avoiding contact with the polysilicon plug 241. Subsequently, the contact is filled with a conductive material.

Figure 18:
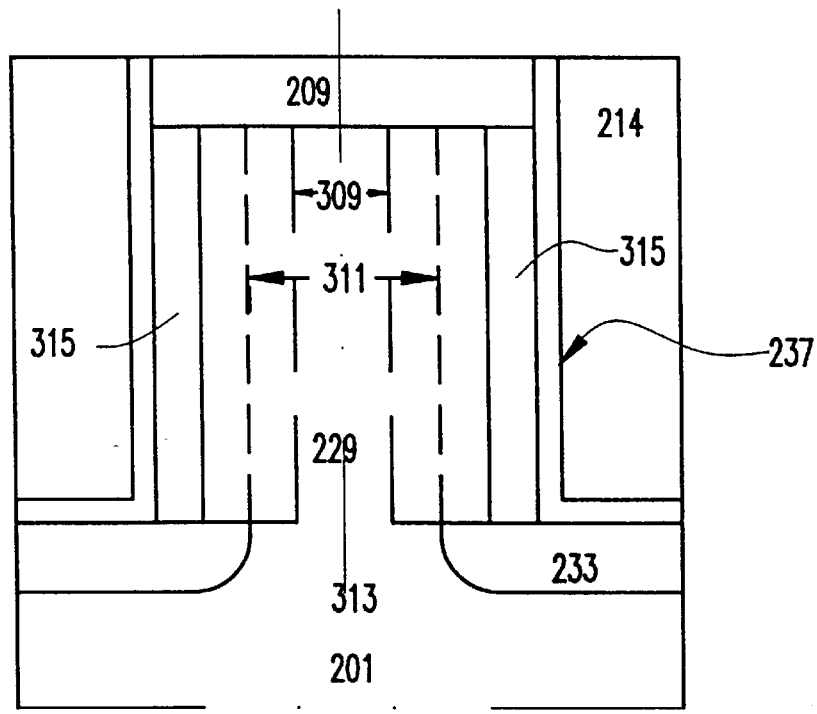
FIG. 18 is a cross sectional view of a portion of the inventive device showing a preferred embodiment for pillar doping.

A preferred embodiment of the inventive structure is shown in FIG. 18. Methods of forming this preferred embodiment are shown in FIGS. 19A through 21B. The pillars shown in these cross sectional views are similar to those depicted in FIG. 13 as pillar 229. In addition, each FIG. 18 through 21B shows ion implanted source and drain regions corresponding to source 233 and drain 209 as shown in FIG. 13.

In a preferred embodiment, the vertical device utilizes a doping level such that the resulting device has good current and low sub-threshold leakage properties. Dopants suitable for source/drain regions are implanted or gaseously doped at the wafer surface. Below the wafer surface, about 0.5 um into the substrate, a more highly doped region is created. This more highly doped region eliminates the cross-talk from cell to cell.

FIG. 18 is a cross sectional view of a pillar as it should appear in the preferred embodiment. The region near the axis of the pillar 229 and base 201 are composed of highly doped silicon regions. The source 209 and drain 233 regions have a counter-implantation relative to the pillar 229 and base 201 doping type i.e. if pillar is p type, implant with n type. In order to create the transfer device channel 315, the pillar 229 has a concentration gradient represented by dashed line pair 309 and 311 wherein the concentration decreases from the center 313 of the pillar through dashed line pair 309 and 311. At the outer edges of the pillar 229 are the lightest doped regions 315 which provide the channel. The transfer gate polysilicon 214 and gate oxide 237 surround either side of the pillar 229.

The doping of the pillar is performed while the dynamic random access memory cell is being constructed. After filling the collar gap with polysilicon and performing ion implantation to form the source one of three techniques described below can be used alone or in combination with one another to complete the doping. With reference to FIG. 3 these techniques will be employed following the step shown in block 104.

Figure 19A:
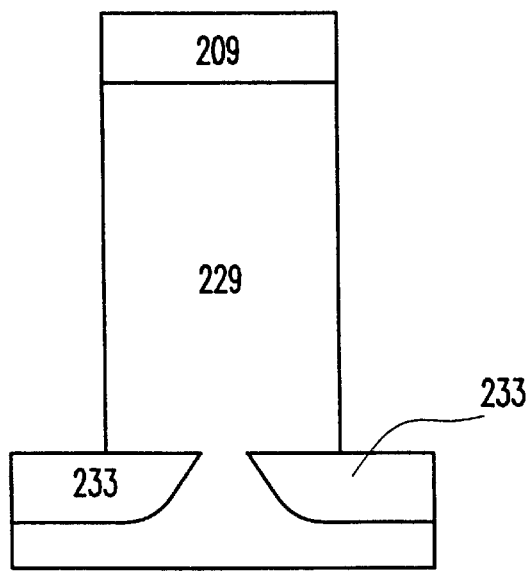
FIGS. 19A and 19B are cross sectional views showing one method of constructing the preferred embodiment shown in FIG. 18.
Figure 19B:
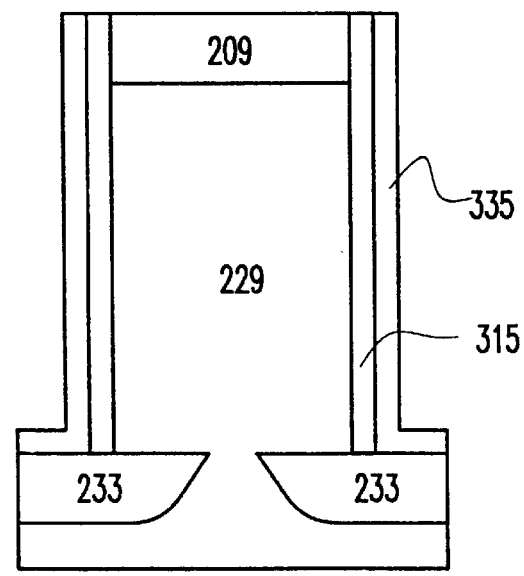

In the first technique, sacrificial oxidation and gate oxidation are used to deplete the dopant on the silicon surface adjacent to the gate oxide. FIG. 19A shows a pillar 229 having ion implanted source and drain regions 209 and 233. In forming the channel, as shown in FIG. 19B, a sacrificial oxide 335 is grown. The effect of growing the sacrificial oxide 335 is to deplete the doping agent, which creates a lighter doped surface 315, which becomes the channel.

Figure 20:
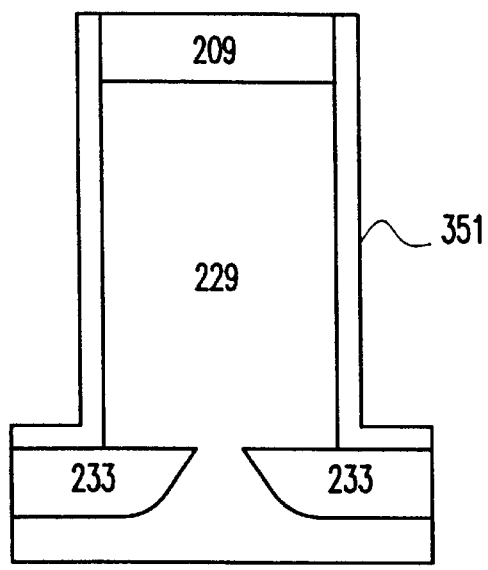
FIG. 20 is a cross sectional view showing a preferred 20 method of constructing the preferred embodiment shown in FIG. 18.

As shown in FIG. 20, the second technique is to use silicon epitaxy to grow a doped channel. To further decrease the doping concentration in the channel, lightly doped epitaxial silicon 351 may be grown to −300D. This film will form the channel 315. A additional benefit is that it further removes the back-to-back transfer gates from each other, thereby further decreasing the cross-talk. A gradient in the pedestal results from diffusion during heating that occurs as the doped epitaxial silicon is grown.

Figures 21A, 21B:
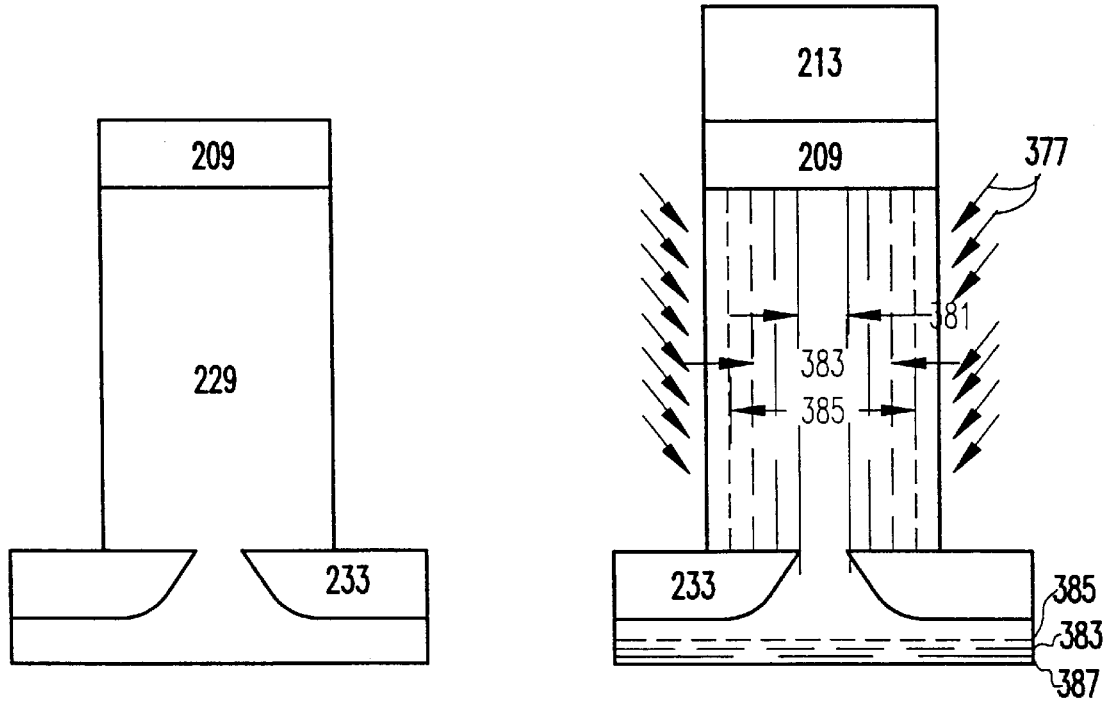
FIGS. 21A and 21B are cross sectional views of another method of constructing the preferred embodiment shown in Figure 18.

FIGS. 21A and 21B illustrate a third process using an angled implant. The starting silicon pillar is lightly doped, as for a channel. By use of an angled implant the doping concentration at the center of the pillar is increased such that cross-talk between back-to-back devices is eliminated. The pillar 229 has ion implanted source and drain regions 209 and 233. In FIG. 21B an angled ion implant is represented by arrows 377 into the pillar 229. A gradient of dopant concentration is represented by dashed lines, where longer dashed lines 379 represent higher concentration. Concentration decreases going out from the center 381 of the pillar 229 through dashed lines 381, 383, and 385. The least concentration is found beyond dashed lines 385.

After one or more of the three techniques described are used, the transfer gate is grown; continue with further processing, as described earlier.

While the invention has been described in terms of a single preferred embodiment, those skilled in the art will recognize that the invention can be practiced with modification within the spirit and scope of the appended claims.

We claim:

1. A five square dynamic random access memory cell, comprising:

a pillar supporting a vertical field effect transistor transfer device;

said vertical device having a long channel length;

said pillar having a width being of minimal dimension; and said pillar having source, gate and drains for two independent cells.

\* \* \* \* \*